(12) United States Patent
Ikeda et al.

(10) Patent No.: US 9,704,693 B2
(45) Date of Patent: Jul. 11, 2017

(54) POWER COMBINER AND MICROWAVE INTRODUCTION MECHANISM

(71) Applicant: TOKYO ELECTRON LIMITED, Tokyo (JP)

(72) Inventors: Taro Ikeda, Nirasaki (JP); Hiroyuki Miyashita, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/166,561

(22) Filed: May 27, 2016

(65) Prior Publication Data

US 2016/0358750 A1 Dec. 8, 2016

(30) Foreign Application Priority Data

Jun. 5, 2015 (JP) .................. 2015-114660

(51) Int. Cl.
| | | |
|---|---|---|
| *H01J 37/32* | (2006.01) | |
| *H01P 5/12* | (2006.01) | |
| *H01P 1/18* | (2006.01) | |
| *H03H 7/40* | (2006.01) | |

(52) U.S. Cl.
CPC .... *H01J 37/3222* (2013.01); *H01J 37/32266* (2013.01); *H01P 1/18* (2013.01); *H01P 5/12* (2013.01); *H03H 7/40* (2013.01)

(58) Field of Classification Search
CPC ... H01J 37/3222; H01J 37/32266; H01P 5/12; H01P 1/18; H03H 7/40
See application file for complete search history.

(56) References Cited

U.S. PATENT DOCUMENTS

| | | | | |
|---|---|---|---|---|
| 9,072,158 B2* | 6/2015 | Ikeda | ................ | H01J 37/32192 |
| 9,299,537 B2* | 3/2016 | Kobayashi | ........ | H01J 37/32201 |
| 9,520,273 B2* | 12/2016 | Osada | ............... | H01J 37/32972 |
| 2003/0178143 A1* | 9/2003 | Perrin | ............... | H01J 37/32192 |
| | | | | 156/345.41 |
| 2006/0137613 A1* | 6/2006 | Kasai | ................ | H01J 37/32192 |
| | | | | 118/723 MW |
| 2011/0018651 A1* | 1/2011 | Ikeda | ................ | H01J 37/32192 |
| | | | | 333/118 |

(Continued)

FOREIGN PATENT DOCUMENTS

| | | |
|---|---|---|
| JP | 11-45799 A | 2/1999 |
| JP | 2007109457 A | 4/2007 |
| JP | 2009230915 A | 10/2009 |

(Continued)

*Primary Examiner* — Don Le
(74) *Attorney, Agent, or Firm* — Nath, Goldberg & Meyer; Jerald L. Meyer

(57) ABSTRACT

A power combiner includes a main body composed of outer and inner conductors, a plurality of power introduction ports configured to introduce electromagnetic wave powers supplied through power supply lines into the main body, a power combining antenna configured to radiate electromagnetic waves to a space between the outer and inner conductors such that the powers are combined, and an output port through which the combined electromagnetic wave is outputted from the main body. The power combining antenna includes a plurality of antenna members, each of which has a first pole and a second pole that is in contact with the inner conductor, and a reflection part configured to reflect the electromagnetic waves.

15 Claims, 8 Drawing Sheets

(56) References Cited

U.S. PATENT DOCUMENTS

2012/0025928 A1* 2/2012 Crouch .................... H01P 1/17
 333/125
2015/0255845 A1* 9/2015 Heid ........................ H01P 5/12
 343/776

FOREIGN PATENT DOCUMENTS

| JP | 2011166740 A | 8/2011 |
| KR | 10-2010-0106611 A | 10/2010 |
| KR | 10-2012-0104429 A | 9/2012 |
| WO | 2008013112 A1 | 1/2008 |

* cited by examiner

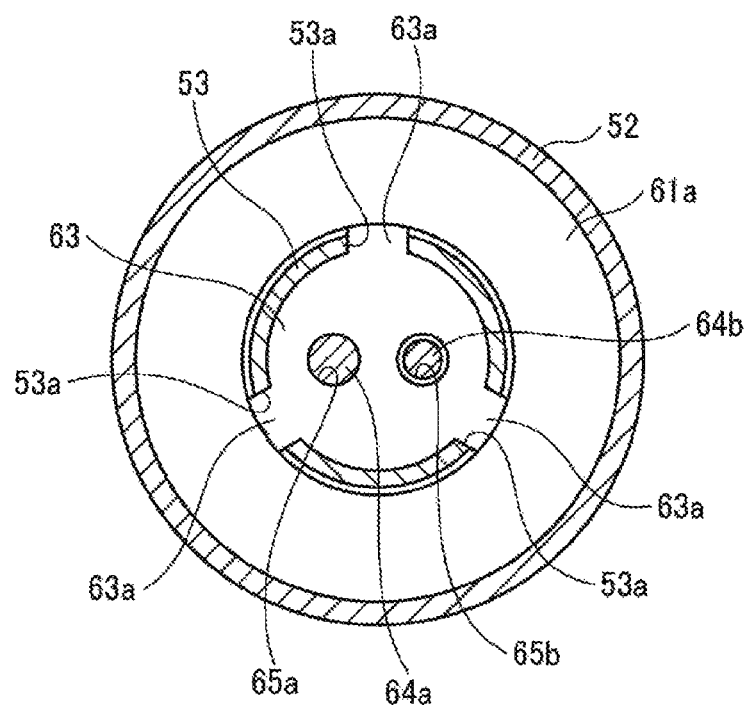

POWER COMBINER AND MICROWAVE INTRODUCTION MECHANISM

CROSS-REFERENCE TO RELATED APPLICATION

This application claims the benefit of Japanese Patent Application No. 2015-114660, filed on Jun. 5, 2015, in the Japan Patent Office, the disclosure of which is incorporated herein in its entirety by reference.

TECHNICAL FIELD

The present disclosure relates to a power combiner and a microwave introduction mechanism using the same.

BACKGROUND

In a process of manufacturing a semiconductor device or a liquid crystal display device, a plasma processing apparatus such as a plasma etching apparatus, a plasma CVD film forming apparatus or the like is used to perform a plasma process such as an etching process, a film forming process or the like on a target substrate (e.g., a semiconductor wafer or a glass substrate).

In recent years, for the aforementioned plasma processing apparatus, attention has been paid to the RLSA™ microwave plasma processing apparatus in which a planar antenna having a plurality of slots formed therein in a predetermined pattern is installed above a chamber, and microwaves introduced from a microwave source are emitted through the slots of the planar antenna and are radiated into the chamber being in a vacuum state via a dielectric microwave transmission plate installed below the slots. Gas introduced into the chamber by an electric field of the microwaves is changed to plasma so that a target object such as a semiconductor wafer or the like is processed.

Furthermore, a microwave plasma processing apparatus having a microwave plasma source, which distributes microwaves on a plurality of paths and introduces the microwaves into a chamber through a plurality of antenna modules having the planar antenna to spatially combine the microwaves inside the chamber, has also been proposed.

Such an apparatus includes a power feed port which is installed in a line extending along an axis of a waveguide having a coaxial structure such that an electromagnetic wave power such as a microwave power is supplied to the waveguide through the power feed port.

However, a power feeding method of the above conventional apparatus provides available power in a narrow range, which makes it difficult to supply power required for a microwave plasma processing apparatus.

On the other hand, a technique which feeds an electromagnetic wave power such as a microwave power to a waveguide of a coaxial structure through a coaxial line from a power introduction port by using a ring-shaped antenna, has been proposed. The power introduction port is installed in a lateral portion of the waveguide. This technique uses a microwave having a low frequency of about 860 MHz to supply more useful power in a wide range.

In recent years, there is a desire to supply power greater than that available in the conventional power feeding technique. To support this, a power combining technique is under consideration.

A Wilkinson combiner is known as such a power combining technique. However, in this technique, a reflection absorption resistor is installed inside a combiner, which inevitably increases the combiner in size. In addition, this technique employs a "direct supply" scheme (which transmits power as is). As such, a power loss is likely to occur, thus generating heat. This reduces an effectively transmissible power.

To address such problems, another power combiner has been proposed which includes: a plurality of power introduction ports; a plurality of power feeding antennas that are installed in the respective power introduction ports and radiate supplied electromagnetic waves into a main body; a combining part that spatially combines the electromagnetic waves radiated into the main body from the plurality of power feeding antennas; and an output port that outputs the electromagnetic waves combined by the combining part. Each of the power feeding antennas includes: an antenna main body equipped with a first pole to which the electromagnetic waves are supplied from the power introduction port and a second pole through the supplied electromagnetic waves are radiated; and a reflection part that is installed to laterally protrude from the antenna main body and reflects the electromagnetic waves. The power feeding antenna is configured to generate standing waves using the electromagnetic waves incident onto the antenna main body and the electromagnetic waves reflected at the reflection part. The electromagnetic waves as the standing waves radiated from the power feeding antennas are combined by the combining part.

Such a power combiner does not require an internal reflection absorption resistor, which achieves miniaturization and avoids the problem of heat generation.

In some instances, for transmission of microwaves, if a higher order mode other than a TEM mode is generated, a propagation characteristic of the microwaves may be degraded. Therefore, it is necessary to suppress the higher order mode as much as possible. However, the conventional power combiner fails to sufficiently suppress the generation of a higher order mode, which makes it difficult to combine microwaves of a high power with high efficiency.

SUMMARY

Some embodiments of the present disclosure provide a power combiner which is capable of achieving a decrease in size and combining microwaves of a high power with high efficiency, and a microwave introduction mechanism using the power combiner.

According to one embodiment of the present disclosure, there is provided a power combiner, including: a main body having a coaxial structure composed of an outer conductor and an inner conductor; a plurality of power introduction ports installed in a lateral side of the outer conductor and configured to introduce electromagnetic wave powers supplied through power supply lines into the main body; a power combining antenna configured to radiate electromagnetic waves which are supplied through the plurality of power introduction ports via the power supply lines, to a space between the outer conductor and the inner conductor of the main body such that the powers are combined; and an output port through which the combined electromagnetic wave is outputted from the main body. The power combining antenna includes: a plurality of antenna members, each of which has a first pole to which the electromagnetic waves are supplied from the power supply line in each of the plurality of power introduction ports and a second pole that is in contact with the inner conductor; and a reflection part installed in a ring shape along an outer side of the inner conductor from both sides of each of the plurality of antenna members and configured to reflect the electromagnetic waves. A standing wave is formed by the electromagnetic waves incident onto the plurality of antenna members and the electromagnetic waves reflected at the reflection part, and the electromagnetic wave powers are combined by a linked behavior between an induced magnetic field and an induced electric field, which are generated inside the main body by the standing wave so that the combined power propagates through the interior of the main body, followed by being outputted through the output port.

According to another embodiment of the present disclosure, there is provided a microwave introduction mechanism for introducing microwaves into a chamber in a microwave plasma source which forms a surface wave plasma inside the chamber by the microwaves, including: a power combiner configured to combine microwave powers supplied from a plurality of power supply lines; an antenna part including a microwave radiating antenna configured to radiate the microwave power combined by the power combiner into the chamber; and a tuner configured to transmit the microwave power combined by the power combiner and configured to match an impedance of a load that includes plasma inside the chamber with a characteristic impedance of a microwave power supply. The power combiner includes: a main body having a coaxial structure composed of an outer conductor and an inner conductor; a plurality of power introduction ports installed in a lateral side of the outer conductor and configured to introduce the microwave powers supplied through the plurality of power supply lines into the main body; a power combining antenna configured to radiate the microwave powers which are introduced through the plurality of power introduction ports via the plurality of power supply lines, to a space between the outer conductor and the inner conductor of the main body such that the microwave powers are combined; and an output port through which the combined microwave is outputted from the main body. The power combining antenna includes: a plurality of antenna members, each of which has a first pole to which the microwaves are supplied from the power supply line in each of the plurality of power introduction ports and a second pole that is in contact with the inner conductor; and a reflection part installed in a ring shape along an outer side of the inner conductor from both sides of each of the plurality of antenna members and configured to reflect the microwaves. A standing wave is formed by the microwaves incident onto the plurality of antenna members and the microwaves reflected at the reflection part, and the microwave powers are combined by a linked behavior between an induced magnetic field and an induced electric field, which are generated inside the main body by the standing wave so that the combined power propagates through the interior of the main body, followed by being outputted through the output port.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 10 is a transverse cross-sectional view taken along a line BB' of FIG. 9.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Power Combiner>

Figure 1A:
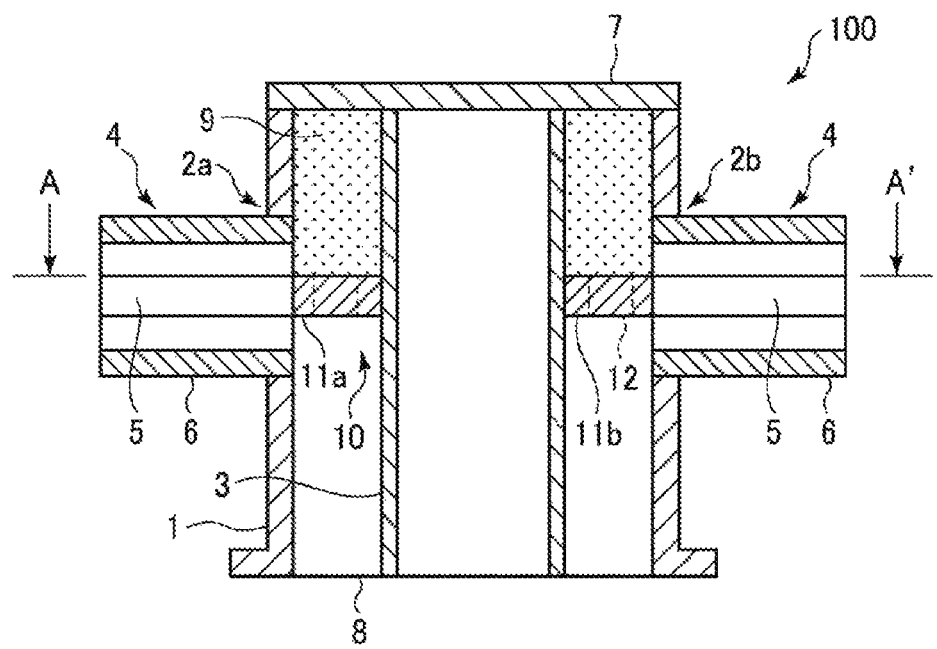
FIGS. 1A and 1B are views illustrating a power combiner according to an embodiment of the present disclosure, FIG. 1A being a vertical cross-sectional view, and FIG. 1B being a transverse cross-sectional view taken along a line AA' of FIG. 1A.
Figure 1B:
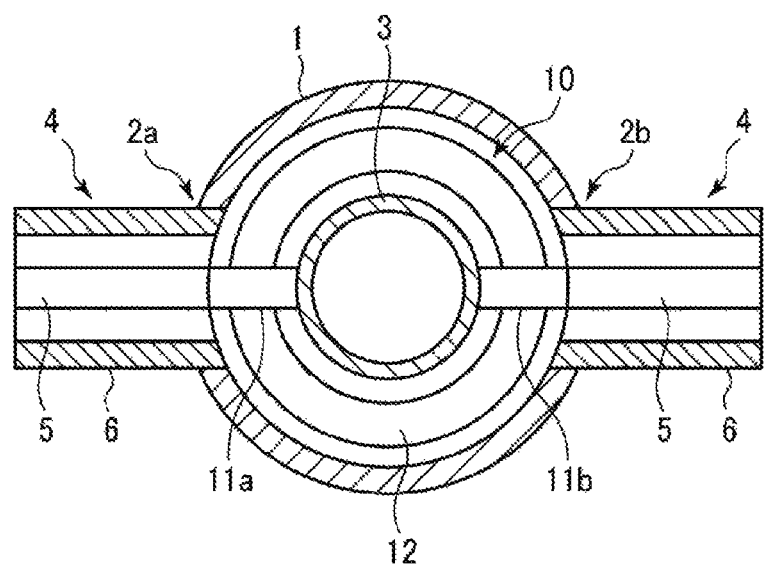

FIGS. 1A and 1B are views illustrating a power combiner 100 according to an embodiment of the present disclosure, FIG. 1A being a cross-sectional view, and FIG. 1B being a transverse cross-sectional view taken along a line AA' of FIG. 1A. The power combiner 100 according to this embodiment may be applied in combining microwaves ranging from 500 to 3,000 MHz. In particular, the power combiner 100 is suitable for combining high power microwaves in a low frequency region having a frequency of 500 to 1,000 MHz, for example, 860 MHz.

The power combiner 100 includes a tubular main tube 1 made of a conductor, and a tubular (or columnar) inner member 3 formed of a conductor and coaxially arranged inside the main tube 1. The combination of the main tube 1 and the inner member 3 constitute a main body having a coaxial structure. The main tube 1 constitutes an outer conductor, and the inner member 3 constitutes an inner conductor. Two power introduction ports 2a and 2b through which a microwave power is introduced are formed in a lateral side of the main tube 1. A reflection plate 7 is installed in one end of the main tube 1, and an output port 8 is formed in the other end of the main tube 1.

The two power introduction ports 2a and 2b of the main tube 1 are formed to face each other. Coaxial lines 4 as power supply lines, each of which includes an inner conductor 5 and an outer conductor 6, are connected to the power introduction ports 2a and 2b, respectively. Further, leading ends of the inner conductors 5 of the coaxial lines 4 are connected to a power combining antenna 10 which is installed toward the inner member 3.

For example, the power combining antenna 10 is formed by machining a metal plate such as an aluminum plate, and then putting the same into a mold made of a dielectric member such as Teflon®. A wave retardation member 9 formed of a dielectric material such as Teflon® is installed between the reflection plate 7 and the power combining antenna 10 to shorten an effective wavelength of a reflected wave. By optimizing a distance from the power combining antenna 10 to the reflection plate 7 and reflecting a microwave (electromagnetic wave) radiated from the power combining antenna 10 at the reflection plate 7, it is possible to output the power at maximum. In this case, the distance from the power combining antenna 10 to the reflection plate 7 is set to about $\lambda g/4 + n\lambda g/2$ (n is an integer greater than or equal to zero).

As shown in FIG. 1B, the power combining antenna 10 includes antenna members 11a and 11b installed to correspond to the respective power introduction ports 2a and 2b, and a reflection part 12 connected to the antenna members 11a and 11b.

Each of the antenna members 11a and 11b has one pole connected to the inner conductor 5 of the coaxial line 4 in the respective power introduction port 2a or 2b and the other pole being in contact with a surface of the inner member 3. Therefore, a microwave is fed from the coaxial line 4 to the one pole, and the microwave is radiated from the other pole. The antenna members 11a and 11b are disposed in a line so that a symmetric power feeding is allowed.

The reflection part 12 has a ring shape that extends from sides of the antenna members 11a and 11b along an outer side of the inner member 3. Further, a phase of a reflected wave is regulated to form a standing wave by the microwave (electromagnetic wave) incident on the antenna members 11a and 11b and the microwave (electromagnetic wave) reflected at the reflection part 12.

The microwaves (electromagnetic waves) are radiated from the power combining antenna 10 so that the microwaves introduced from the power introduction ports 2a and 2b are combined in a space defined between the main tube 1 and inner member 3. The combined microwaves as the standing wave propagates through the space defined between the main tube 1 and the inner member 3 and are outputted from the output port 8.

A portion where the power combining antenna 10 is positioned is defined as an antinode of the standing wave, and a portion where the output port 8 is positioned is defined as a node of the standing wave. However, for a microwave of a low frequency, the maximum power is sometimes not obtained due to a limitation in the diameter direction even if the distance from the power combining antenna 10 to the reflection plate 7 is set to about $\lambda g/4 + n\lambda g/2$ (n is an integer greater than or equal to zero). In this case, a shape of the power combining antenna 10 may be optimized such that the antinode of the standing wave is induced under the power combining antenna 10, rather than the position of the power combining antenna 10.

In the power combiner 100 configured as above, when the microwaves (electromagnetic waves) propagated through the coaxial lines 4 reach the one poles of the respective antenna members 11a and 11b of the power feeding antenna 10 in the respective power introduction ports 2a and 2b, the microwaves (electromagnetic waves) propagate through the respective antenna members 11a and 11b and are radiated from the other poles of the leading ends of the respective antenna members 11a and 11b. Further, the electromagnetic waves propagating through the antenna members 11a and 11b are reflected at the reflection part 12 so that the reflected waves are combined with the microwaves incident on the antenna members 11a and 11b. At this time, phases of the reflected waves are adjusted to generate standing waves. When the standing waves are generated at the position where the power combining antenna 10 is disposed, a magnetic field is induced along an inner wall of the inner member 3, which induce an electric field. Such behavior changes the combined microwaves (electromagnetic waves) into the standing waves. The standing waves propagate through the space between the main tube 1 and the inner member 3 and are outputted from the output port 8.

As described above, the microwave powers fed through the power introduction ports 2a and 2b are combined using the power combining antenna 10 in a state where the poles of the antenna members 11a and 11b at the leading ends thereof are in contact with the inner member 3, and the reflection part 12 is configured to have the ring shape. This does not cause any joints, which prevents a strong electric field from being radiated at the joint. Therefore, it is possible to output a microwave mainly using a TEM mode by suppressing the occurrence of a higher order mode. Further, since the power introduction ports 2a and 2b are installed to face each other and the antenna members 11a and 11b are disposed in a line to perform the symmetric power feeding, it is possible to more effectively suppress the occurrence of the higher order mode. As a result, it is possible to combine microwaves (electromagnetic waves) with high efficiency even for a high power. In this case, by supplying microwave power having the same phase and the same power through the microwave power introduction ports 2a and 2b, it is possible to achieve a power combination with a higher efficiency.

In this regard, an additional description will be given below.

Figure 2:
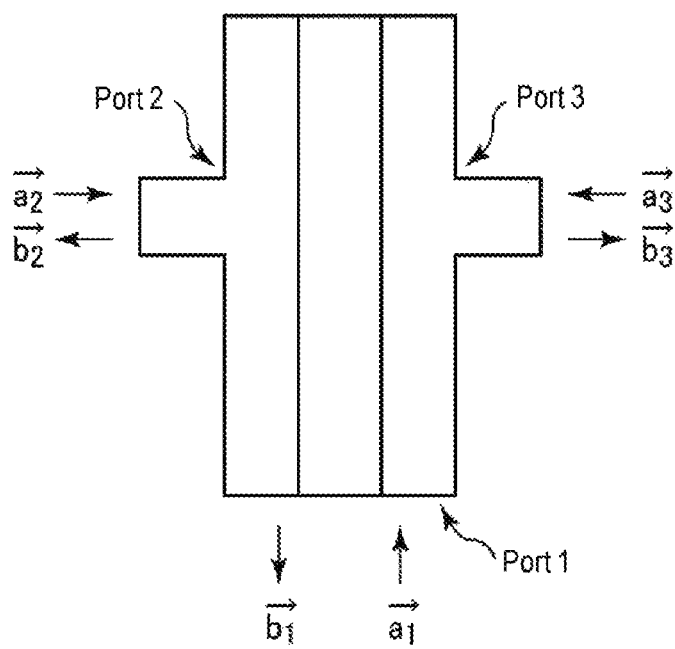
FIG. 2 is a view illustrating a model used to perform a theoretical calculation of an electromagnetic wave combination.

As illustrated in FIG. 2, assuming that a port corresponding to the output port 8 refers to a port 1, ports corresponding to the two power introduction ports 2a and 2b refer to ports 2 and 3, amplitudes of electromagnetic waves progressing in an input direction respectively refer to $a_1$, $a_2$, and $a_3$, and amplitudes of electromagnetic waves progressing in an output direction respectively refer to b1, b2, and b3, a matrix S can be expressed by the following Equation (1). Further, a reflection coefficient at the port 2 when combining powers introduced through the ports 2 and 3 can be obtained by the following Equation (2). In Equation (2), when input powers inputted to the ports 2 and 3 are expressed by the following Equation (3), Equation (4) is derived by a shape design optimization, and Equation (5) is derived from Equation (4). Further, by rearranging this equation, a reflection coefficient at the port 2 is obtained by Equation (6). Through a similar calculation, a reflection coefficient at the port 3 is obtained by Equation (7).

$$\begin{pmatrix} \vec{b_1} \\ \vec{b_2} \\ \vec{b_3} \end{pmatrix} = \begin{pmatrix} S_{11} & S_{21} & S_{31} \\ S_{21} & S_{22} & S_{32} \\ S_{31} & S_{32} & S_{33} \end{pmatrix} \begin{pmatrix} \vec{a_1} \\ \vec{a_2} \\ \vec{a_3} \end{pmatrix} \quad (1)$$

$$\Gamma_2 = \frac{|\vec{b_2}|}{|\vec{a_2}|} = \left| S_{22} + \left(\frac{\vec{a_3}}{\vec{a_2}}\right) S_{32} \right| \quad (2)$$

$$\vec{P_2} = P_2 e^{j\theta_2}, \vec{P_3} = P_3 e^{j\theta_3}, \Delta\theta = \theta_2 - \theta_3 \quad (3)$$

$$S_{22} = (1/2)e^{j\theta_{22}}, S_{32} = (1/2)e^{j\theta_{32}}, \theta_{22} + \theta_{32} = \pi \quad (4)$$

$$\Gamma_2 = (1/2)|e^{j\theta_{22}} + \gamma e^{j\theta_{32}} e^{j\Delta\theta}|, (\gamma = \sqrt{P_3/P_2}) \quad (5)$$

$$\Gamma_2 = (1/2)\sqrt{1 + \gamma^2 - 2\gamma\cos(\Delta\theta)} \quad (6)$$

$$\Gamma_3 = (1/2)\sqrt{1 + (1/\gamma)^2 - (2/\gamma)\cos(\Delta\theta)} \quad (7)$$

Figure 3:
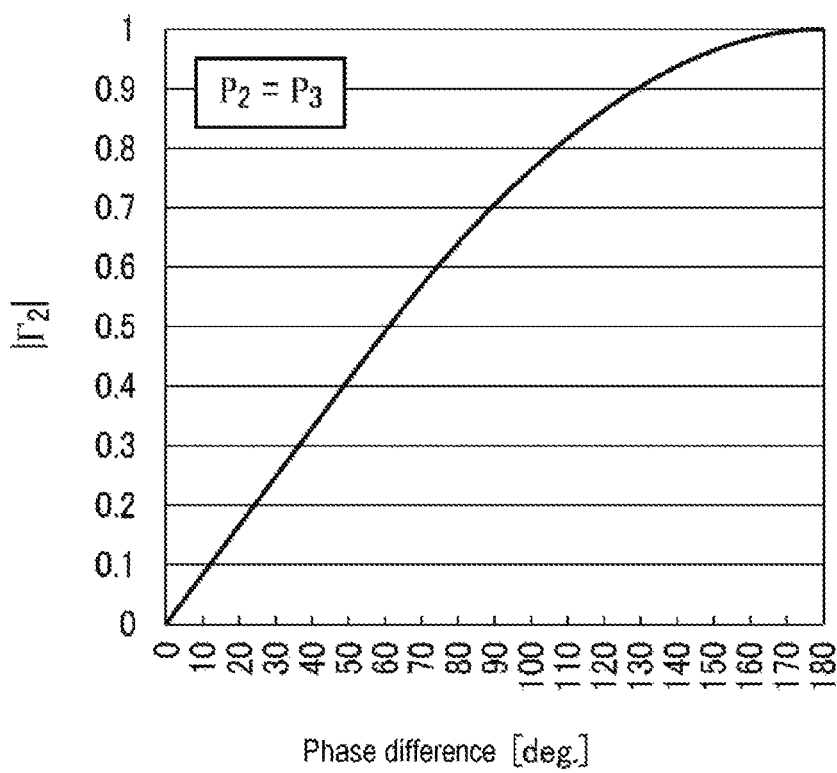
FIG. 3 is a graph illustrating a relationship between a phase difference and a reflection coefficient in a case where powers at ports 2 and 3 are identical to each other, in the model of FIG. 2.
Figure 4:
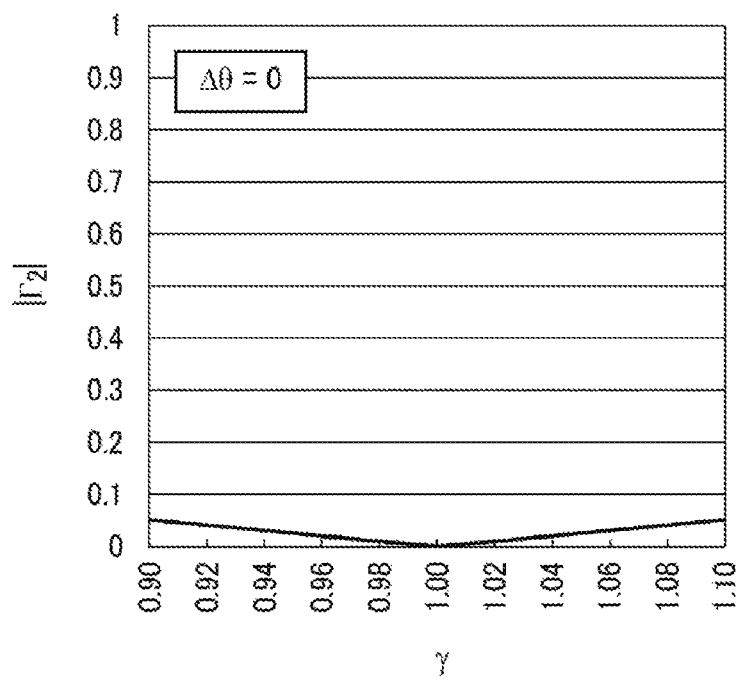
FIG. 4 illustrates a relationship between power and a reflection coefficient in a case where phases at ports 2 and 3 are identical to each other, in the model of FIG. 2.

Equations (6) and (7) are equations expressing reflection coefficients when combining the powers. FIG. 3 illustrates a relationship between a phase difference and a reflection coefficient in a case where the powers at the ports 2 and 3 are identical to each other, and FIG. 4 illustrates a relationship between power and a reflection coefficient in a case where phases at the ports 2 and 3 are identical to each other. From FIGS. 3 and 4, it can be seen that a power combination with a low reflectivity and a high efficiency is achieved by supplying microwave powers having the same phase and the same power through the microwave power introduction ports 2a and 2b. Furthermore, it can be seen from FIGS. 3 and 4 that the reflection coefficient is greatly affected by the phase difference, but is less affected by the power. This is supported by results obtained by performing a simulation using an S parameter by a quasi-Newton algorithm using a finite element method.

Further, as described above, the microwave powers introduced through the two power introduction ports 2a and 2b can be combined using only the power combining antenna 10, and an internal reflection absorption resistor is thus unnecessary. Therefore, it is possible to implement a power combiner which is more compact than power combiners available in the marketplace, thus avoiding the problem of heat generation.

Although the conventional power combiner combines power using an antenna and has a compact structure, it is difficult to perform a high power combination with high efficiency using microwaves having a low frequency of about 860 MHz. In other words, it has been newly discovered that, in the case of performing the high power combination using a structure in which an electric field is radiated from a reflection part of an antenna to a space as in the conventional power combiner, a higher order mode other than the TEM mode occurs, which makes it difficult to combine power with high efficiency.

In contrast, it was found that, even if the power combiner 100 of this embodiment performs the high power combination using microwaves having a low frequency of about 860 MHz, a higher order mode is unlikely to occur, thus combining powers with high efficiency.

Figure 5:
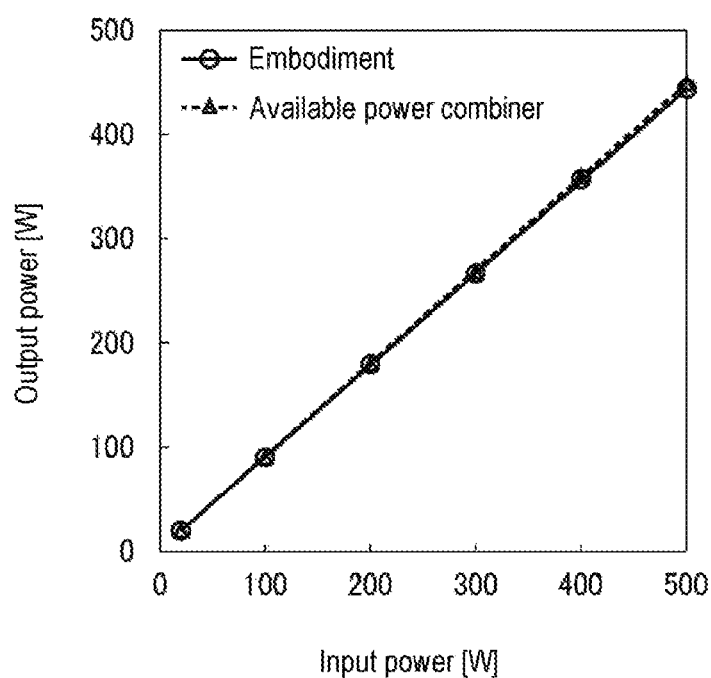
FIG. 5 is a graph illustrating a relationship between the sum of input powers inputted from two input ports and an output power when combining a microwave power of 860 MHz in the power combiner, according to the embodiment of the present disclosure, as compared to an available power combiner.
Figure 6:
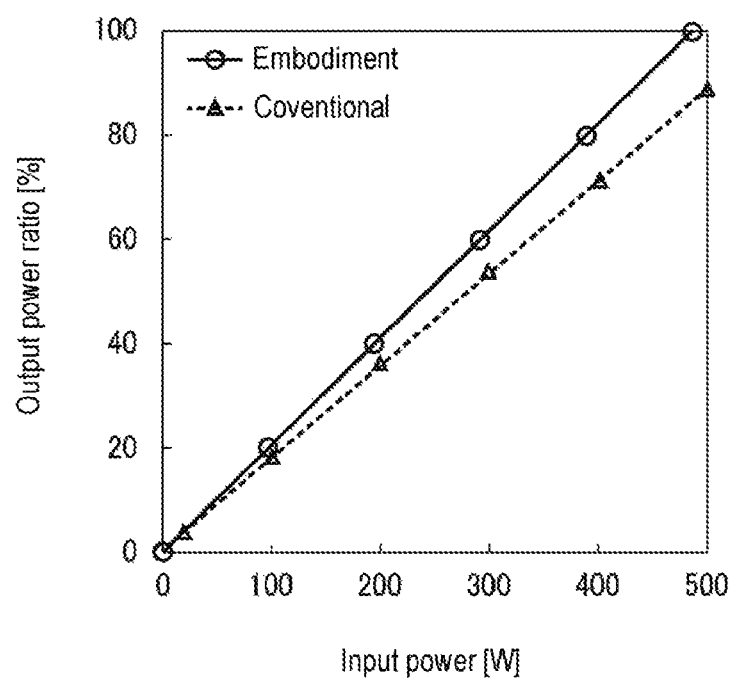
FIG. 6 is a graph illustrating a relationship between the sum of input powers inputted through two input ports and a ratio of an output power to an output of the power combiner according to the embodiment of the present disclosure, when combining microwave powers of 860 MHz in the conventional power combiner, as compared to the power combiner according to the embodiment of the present disclosure.

In practice, the power combiner 100 of this embodiment performed the power combination using microwaves of 860 MHz. As a result, it was found that, as shown in FIG. 5, an output power is 90% or more of the sum of input powers from two input ports, so that the power combiner of this embodiment has a performance equivalent to that of a power combiner which is available in the marketplace. Furthermore, a comparison was performed to check a difference between results obtained by combining power of microwaves of 860 MHz using the conventional power combiner and the power combiner of this embodiment. A result of the comparison is shown in FIG. 6. FIG. 6 is a graph illustrating a relationship between the sum of input powers from two input ports and an output power ratio at which an output power is 100% when the sum of the input powers is 500 W in the power combiner of this embodiment, with the sum as the horizontal axis and the output power ratio as the vertical axis. It has been confirmed that the output power ratio is 88.3% when the sum of the input powers in the conventional power combiner is 500 W, so that the output power of the conventional power combiner is at a low level of 10% compared to that of the power combiner of this embodiment.

<Plasma Processing Apparatus>

Hereinafter, a plasma processing apparatus that performs a plasma process by generating plasma using a microwave introduction mechanism employing the above-described power combiner will be described.

Figure 7:
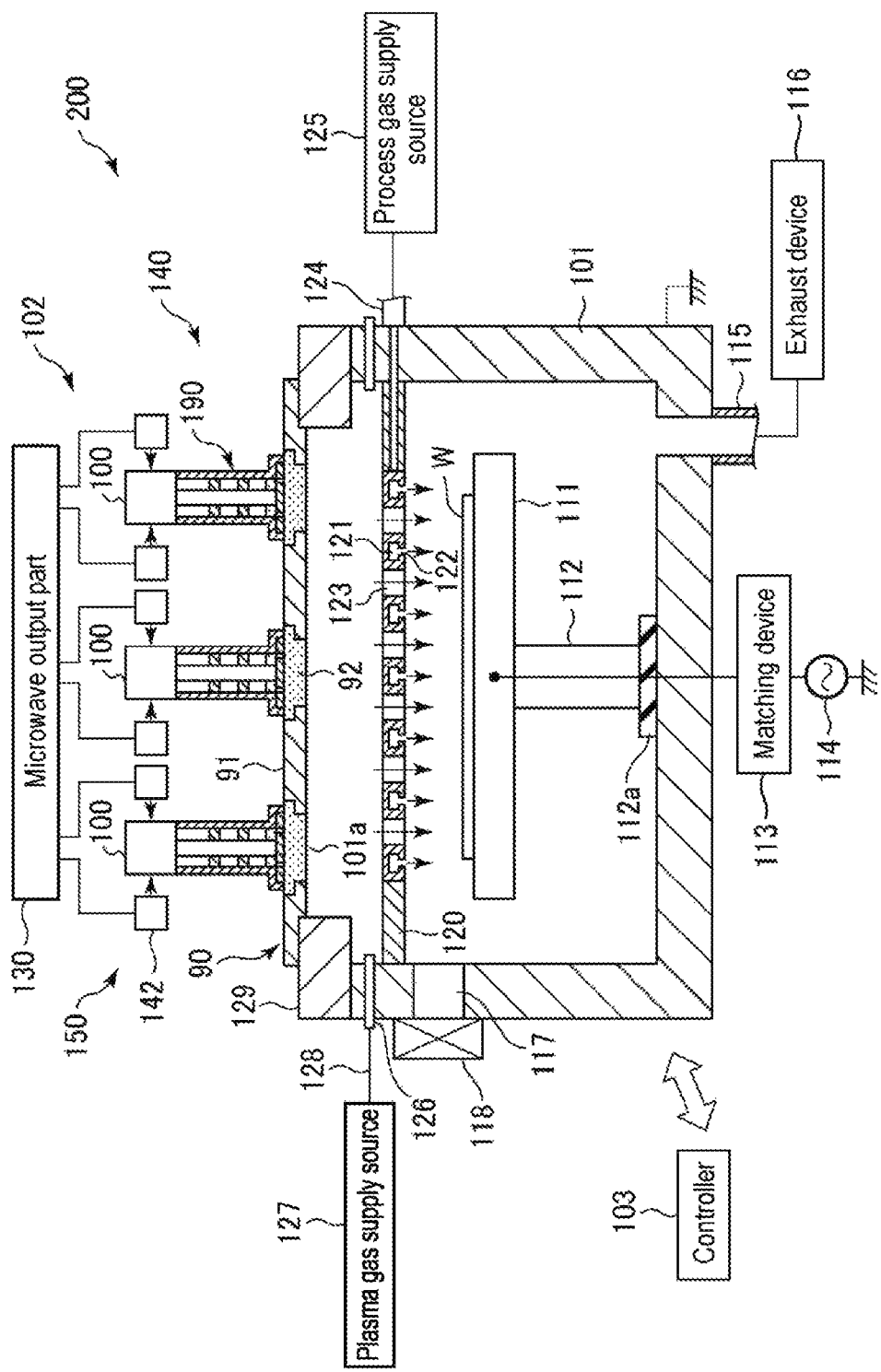
FIG. 7 is a sectional view illustrating a schematic configuration of a plasma processing apparatus equipped with a microwave introduction mechanism which is applied to the power combiner according to the embodiment of the present disclosure.
Figure 8:
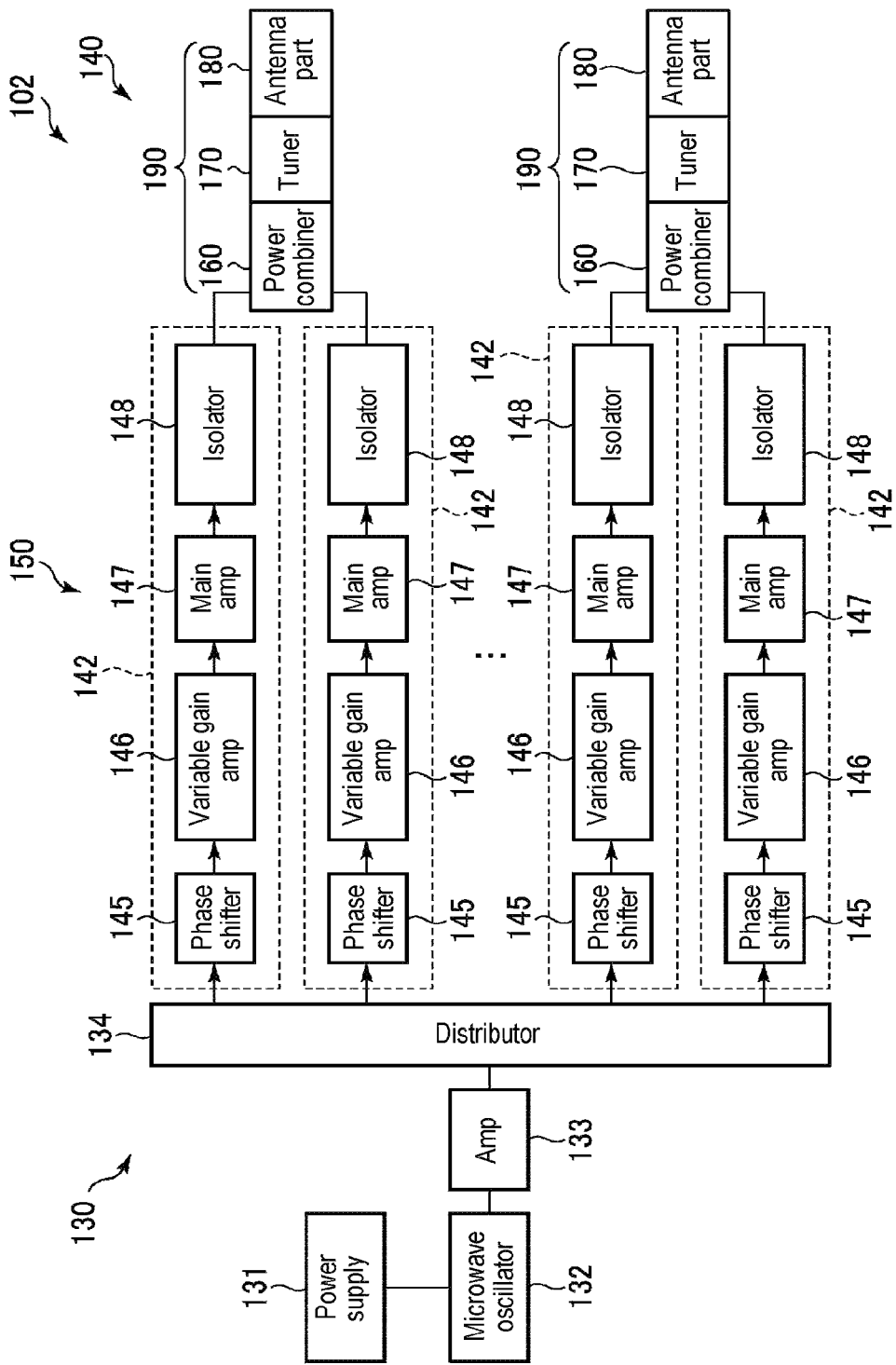
FIG. 8 is a block diagram illustrating a configuration of a microwave plasma source used in the plasma processing apparatus of FIG. 7.

FIG. 7 is a sectional view illustrating a schematic configuration of a plasma processing apparatus equipped with a microwave introduction mechanism which is applied to the power combiner according to the embodiment of the present disclosure. FIG. 8 is a block diagram illustrating a configuration of a microwave plasma source illustrated in FIG. 7.

A plasma processing apparatus 200 is configured as a plasma etching apparatus which performs a plasma process (e.g., etching process) on a semiconductor wafer as a target object. The plasma processing apparatus 200 includes: a grounded airtight chamber 101 which has a substantially cylindrical shape and is formed of a metal material such as aluminum, stainless steel or the like; a microwave plasma source 102 configured to form a microwave plasma inside the chamber 101; and a controller 103.

The chamber 101 includes an opening 101a formed in an upper portion of the chamber 101. A top plate 90 of the microwave plasma source 102 is installed to cover the opening 101a.

A susceptor 111 configured to horizontally support a wafer W as the target object is installed inside the chamber 101. The susceptor 111 is supported by a cylindrical support member 112 installed upright on the center of the bottom of the chamber 101 via an insulating member 112a. The susceptor 111 and the support member 112 are made of, for example, aluminum whose surface is alumite-treated (anodized).

In addition, although not shown, the susceptor 111 includes an electrostatic chuck for electrostatically adsorbing the wafer W, a temperature control mechanism, a gas passage through which a heat transfer gas is supplied onto a rear surface of the wafer W, lift pins configured to move up and down to transfer the wafer W, and so on. Further, the susceptor 111 is electrically coupled to an RF (Radio Frequency) bias power supply 114 via a matching device 113. When RF power is supplied from the RF bias power supply 114 to the susceptor 111, ions are retracted to the wafer W side.

An exhaust pipe 115 is connected to the bottom of the chamber 101. The exhaust pipe 115 is connected to an exhaust device 116 including a vacuum pump. The exhaust device 116 is actuated to exhaust the chamber 101 so that the interior of the chamber 101 can be depressurized up to a predetermined degree of vacuum. A loading/unloading port 117, through which the wafer W is loaded into and unloaded from the chamber 101, and a gate valve 118, for opening/closing the loading/unloading port 117, are installed in a side wall of the chamber 101.

A shower plate 120 is horizontally installed above the susceptor 111 inside the chamber 101 to discharge a plasma etching process gas toward the wafer W. The shower plate 120 includes gas passages 121 formed in a grid pattern and a plurality of gas discharge holes 122 formed in the gas passages 121. Space portions 123 are formed between the grid-patterned gas passages 121. A pipe 124 extending outward from the chamber 101 is connected to the gas passages 121 of the shower plate 120. The pipe 124 is connected to a process gas supply source 125.

On the other hand, a ring-shaped plasma gas introduction member 126 is installed at a position above the shower plate 120 of the chamber 101 along a wall of the chamber 101. The plasma gas introduction member 126 has a plurality of gas discharge holes formed in an inner circumference thereof. A plasma gas supply source 127 configured to supply a plasma gas is connected to the plasma gas introduction member 126 through a pipe 128. An example of the plasma gas may include an Ar gas.

The plasma gas introduced into the chamber 101 through the plasma gas introduction member 126 is converted into plasma by the microwaves introduced into the chamber 101 from the microwave plasma source 102, so that the Ar plasma passes through the space portions 123 of the shower plate 120 to excite the process gas discharged through the gas discharge holes 122 of the shower plate 120, thus forming plasma of the process gas.

The microwave plasma source 102 is installed such that the top plate 90 is supported by a support ring 129 mounted on the upper portion of the chamber 101 so as to air-tightly seal a gap between the top plate 90 and the support ring 129. The top plate 90 functions as a vacuum seal and as a microwave transmission plate, and includes metal frames 91 and dielectric members 92 fitted into the frames 91. Each of the dielectric members 92 is made of a dielectric material such as quartz, and transmits microwaves therethrough.

As illustrated in FIG. 8, the microwave plasma source 102 includes: a microwave output part 130 configured to distribute and output microwaves on a plurality of paths; a microwave introduction part 140 configured to introduce the microwaves into the chamber 101 through a plurality of microwave introduction mechanisms; and a microwave supply part 150 configured to supply the microwaves, which are distributed and outputted on the plurality of paths from the microwave output part 130, to the respective microwave introduction mechanisms of the microwave introduction part 140.

The microwave output part 130 includes a power supply 131, a microwave oscillator 132, an amplifier 133 configured to amplify the oscillated microwaves, and a distributor 134 configured to distribute the amplified microwaves on the plurality of paths.

For example, the microwave oscillator 132 PLL-oscillates microwaves having a range of about 500 to 3,000 MHz, and in other embodiments, a range of about 500 to 1,000 MHz (e.g., 860 MHz). The distributor 134 distributes the microwaves amplified in the amplifier 133 while taking an impedance matching between an input side and an output side such that as little loss of the microwave as possible occurs.

The microwave supply part 150 includes a plurality of amplifying parts 142 configured to mainly amplify the microwaves distributed by the distributor 134. Each of the amplifying parts 142 includes a phase shifter 145, a variable gain amplifier 146, a main amplifier 147 constituting a solid state amplifier, and an isolator 148.

The phase shifter 145 is configured to change a phase of a microwave using a slug tuner and can adjust the phase to modulate a radiation characteristic. For example, the phase shifter 145 can adjust a phase of a respective antenna module to control directionality, thus changing a plasma distribution. In addition, the phase shifter 145 can shift the phase by 90 degrees between adjacent antenna modules to obtain a circularly-polarized wave, which will be described later. However, the phase shifter 145 may be omitted if such modulation of the radiation characteristic is not needed.

The variable gain amplifier 146 is to adjust a power level of microwave to be inputted to the main amplifier 147, thus adjusting variation in respective antenna modules or a plasma intensity. By changing the variable gain amplifier 146 for each antenna module, it is possible to allow a distribution to be produced in generated plasma.

The main amplifier 147 constituting a solid state amplifier may be configured to include, for example, an input matching circuit, a semiconductor amplifying element, an output matching element and a high-Q resonance circuit.

The isolator 148 is used to isolate a reflected microwave which is reflected at the microwave introduction part 140 and orients to the main amplifier 147, and includes a circulator and a dummy load (coaxial terminator). The circulator guides microwaves reflected at an antenna part 180 (which will be described below) to the dummy load. The dummy load converts the reflected microwaves guided by the circulator into heat.

The microwave introduction part 140 includes a plurality of microwave introduction mechanisms 190 configured to introduce microwaves into the chamber 101. Each of the microwave introduction mechanisms 190 is configured to combine microwave powers amplified by a pair of amplifying parts 142 and output the combined microwave power to the inside of the chamber 101. Each of the microwave introduction mechanisms 190 includes a power combiner 160, a tuner 170, and the antenna part 180. A detailed configuration of the microwave introduction mechanism 190 will be described below.

The controller 103 is configured to control respective parts of the plasma processing apparatus 200. The controller 103 includes a storage part for storing process sequences of the plasma processing apparatus 200 and process recipes as control parameters, an input means, a display, and the like, and is configured to perform a predetermined control according to a selected process recipe.

<Microwave Introduction Mechanism>

Hereinafter, the microwave introduction mechanism 190 will be described in detail.

Figure 9:
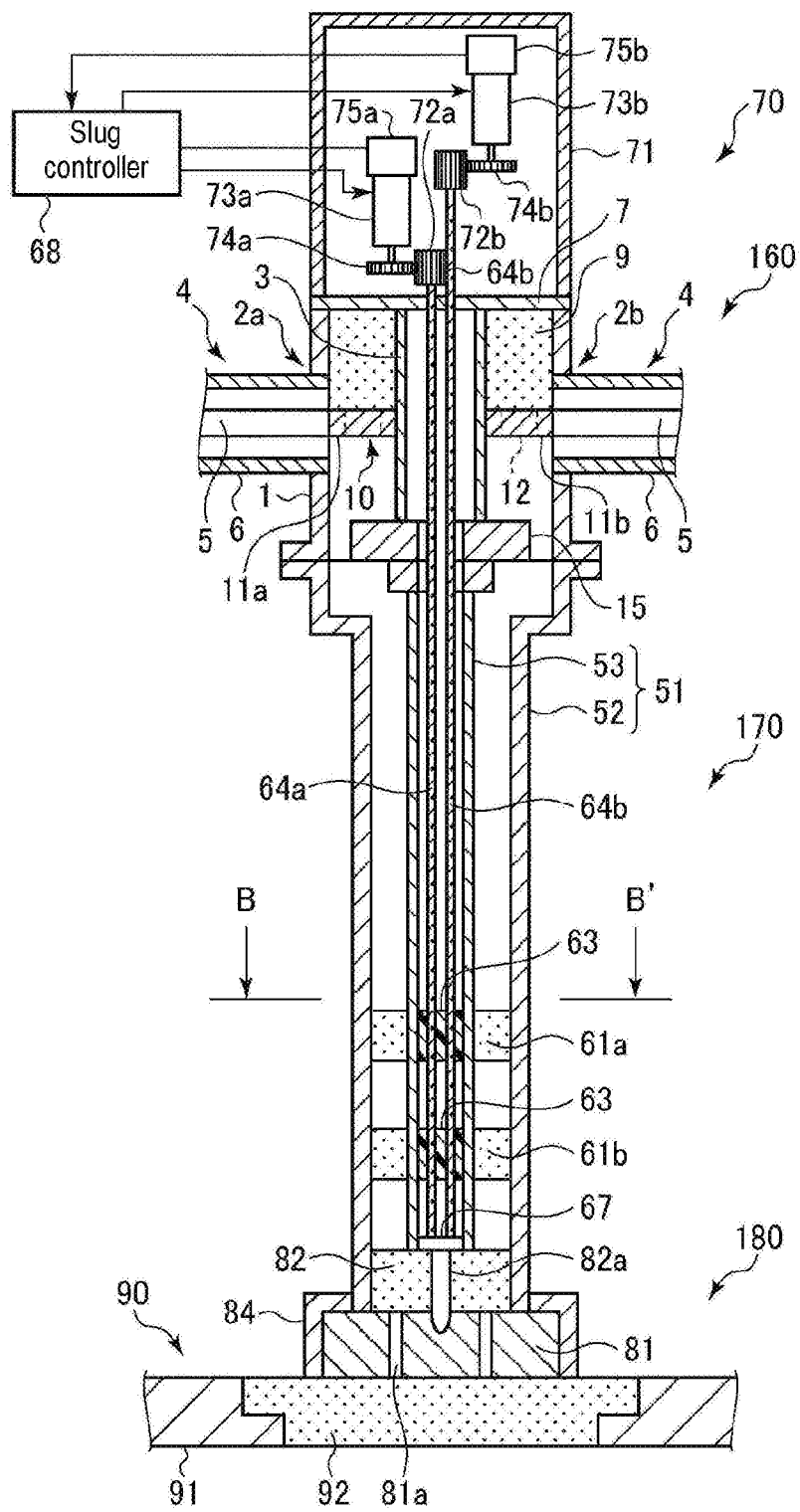
FIG. 9 is a cross-sectional view of the microwave introduction mechanism.

FIG. 9 is a cross-sectional view of the microwave introduction mechanism 190. FIG. 10 is a transverse cross-sectional view taken along a line B-B' of FIG. 9, illustrating a slug and a sliding member in the microwave introduction mechanism 190.

As described above, the microwave introduction mechanism 190 includes the power combiner 160, the tuner 170, and the antenna part 180. Further, the microwave introduction mechanism 190 includes a slug drive part 70 configured to drive slugs of the tuner 170.

The power combiner 160 has the same structure as the above-described power combiner 100 of FIGS. 1A and 1B. In FIG. 9, parts identical to those of FIGS. 1A and 1B are provided with identical reference numerals, and a description thereof will be omitted. Microwave power amplified by the amplifying part 142 of the microwave supply part 150 is transmitted to the coaxial lines 4 that are connected to both the power introduction ports 2a and 2b of the power combiner 160 of FIG. 9, respectively.

The tuner 170 includes a transmission line 51 having a coaxial structure composed of an outer conductor 52 and an inner conductor 53, and first and second slugs 61a and 61b that move upward and downward between the outer and inner conductors 52 and 53. The tuner 170 is connected to the power combiner 160 through a connector 15. The outer conductor 52 is connected to the main tube 1 of the power combiner 160, and the inner conductor 53 is connected to the inner member 3 of the power combiner 160. The tuner 170 induces the microwave power combined by the power combiner 160 to the antenna part 180 and moves the first and second slugs 61a and 61b to match the impedance of a load that includes plasma inside the chamber 101 with the characteristic impedance of a microwave power supply 131 of the microwave output part 130.

Among these slugs, the first slug 61a is installed at the slug drive part 70 side and the second slug 61b is installed at the antenna part 180 side. The first and second slugs 61a and 61b are moved upward and downward by rotating two slug moving shafts 64a and 64b for slag movement, which are composed of a trapezoidal threaded rod extending from the slug drive part 70 in a longitudinal direction of an internal space of the inner member 3 of the power combiner 160 and an internal space of the inner conductor 53 of the tuner 170.

As shown in FIG. 10, the first slag 61a made of dielectric has an annular shape, and a slip member 63 made of a slippery resin is fitted into the first slag 61a. The slip member 63 is formed with a screw hole 65a with which the slag moving shaft 64a is screwed, and a through hole 65b into which the slag moving shaft 64b is inserted. Likely, the second slag 61b has also a screw hole 65a and a through hole 65b. However, contrary to the first slag 61a, the screw hole 65a is screwed with the slag moving shaft 64b and the slag moving shaft 64a is inserted into the through hole 65b. With this configuration, the first slag 61a is moved up and down as the slag moving shaft 64a is rotated, while the second slag 61b is moved up and down as the slag moving shaft 64b is rotated. That is to say, the first slag 61a and the second slag 61b are moved up and down by means of a screw mechanism composed of the slag moving shafts 64a and 64b and the slip member 63.

Three slits 53a are formed at equal intervals in the inner conductor 53 in the longitudinal direction. On the other hand, the slip member 63 has three projections 63a formed at equal intervals to correspond to these slits 53a. The slip member 63 is fitted into the first slag 61a and the second slag 61b while the projections 63a are brought into contact with inner peripheries of the first and second slags 61a and 61b. An outer peripheral surface of the slip member 63 is in contact with an inner peripheral surface of the inner conductor 53 with no margin. Therefore, when the slag moving shafts 64a and 64b are rotated, the slip member 63 is moved up and down while sliding along the inner conductor 53. That is to say, the inner peripheral surface of the inner conductor 53 acts as a sliding guide for guiding the first and second slags 61a and 61b.

The slag moving shafts 64a and 64b extend up to the slag drive part 70 through the reflective plate 58. A bearing (not shown) is interposed between the slag moving shafts 64a and 64b and the reflective plate 58. A bottom plate 67 made of a conductor is installed in the lower end of the inner conductor 53.

The slag drive part 70 includes a housing 71 into which the slag moving shafts 64a and 64b extend. Gears 72a and 72b are respectively installed on upper ends of the slag moving shafts 64a and 64b. In addition, the slag drive part 70 includes a motor 73a for rotating the slag moving shaft 64a and a motor 73b for rotating the slag moving shaft 64b. A gear 74a is attached to a shaft of the motor 73a and a gear 74b is attached to a shaft of the motor 73b. Thus, the gear 74a engages with the gear 72a and the gear 74b engages with the gear 72b. Therefore, the slag moving shaft 64a is rotated by the motor 73a through the gears 74a and 72a, and the slag moving shaft 64b is rotated by the motor 73b through the gears 74b and 72b. The motors 73a and 73b are, for example, stepping motors.

The slag moving shaft 64b is longer than the slag moving shaft 64a so that the slag moving shaft 64b is extended to a higher level. Therefore, since vertical positions of the gears 72a and 72b are offset and the motors 73a and 73b are also vertically offset, a space for a power transmission mechanism composed of the motors and the gears may be small and the housing 71 may have the same diameter as that of the outer conductor 52.

Incremental encoders 75a and 75b, which are directly connected to output shafts of the respective motors to detect positions of the first and second slags 61a and 61b, are installed on the motors 73a and 73b, respectively.

The positions of the first and second slags 61a and 61b are controlled by a slag controller 68. Specifically, based on an input terminal impedance value detected by an impedance detector (not shown) and position information of the first and second slags 61a and 61b detected by the encoders 75a and 75b, the slag controller 68 sends control signals to the motors 73a and 73b to control the positions of the first and second slags 61a and 61b. In this way, an impedance adjustment is performed. The slag controller 68 executes an impedance matching such that a resistance of a terminal becomes, for example, 50Ω. If only one of the two slags 61a and 61b is moved, the impedance draws a trajectory which passes through the origin of the Smith chart. If both of the two slags 61a and 61b are moved, only a phase is rotated.

The antenna part 180 includes a planar slot antenna 81 functioning as a microwave radiation antenna and having slots 81a formed therein, and a wave retardation member 82 installed on an upper surface of the planar slot antenna 81. The dielectric member 92 of the top plate 90 is installed to correspond to the planar slot antenna 81. A cylindrical member 82a made of a conductor passes through the center of the wave retardation member 82 such that the bottom plate 67 and the planar slot antenna 81 are connected to each other. Thus, the inner conductor 53 of the tuner 170 is coupled to the planar slot antenna 81 through the bottom plate 67 and the cylindrical member 82a. A lower end of the outer conductor 52 extends to the planar slot antenna 81, and an outer periphery of the wave retardation member 82 is covered with the outer conductor 52. An outer periphery of the planar slot antenna 81 is covered with a coating conductor 84.

The wave retardation member 82 and the dielectric member 92 have a dielectric constant greater than that in vacuum and is made of, for example, quartz, ceramics, a fluorine-based resin such as polytetrafluoroethylene, or a polyimide-based resin. Since the wavelength of a microwave is lengthened in vacuum, the wave retardation member 82 and the dielectric member 92 have the function of reducing the size of an antenna by shortening the microwave wavelength. The wave retardation member 82 can adjust the phase of the microwave by its thickness. The thickness of the wave retardation member 82 is adjusted such that a bonding portion between the top plate 90 and the planar slot antenna 81 corresponds to an "antinode" of the standing wave. This allows reflection to be at a minimum and a radiation energy of the planar slot antenna 81 to be at a maximum.

In the top plate 90, the dielectric member 92 is configured to be fitted into the frame 91, and is installed to be in contact with the planar slot antenna 81. Microwaves amplified by the main amplifier 147 are combined in the power combiner 160, followed by passing through a space between peripheral walls of the inner and outer conductors 53 and 52 of the tuner 170, followed by reaching the antenna part 180. In the antenna part 180, the microwaves as surface waves pass through the wave retardation member 82 and subsequently, are transmitted to the slots 81a of the planar slot antenna 81. Subsequently, the surface waves pass through the dielectric member 92 of the top plate 90 and reach a surface of the dielectric member 92 that is in contact with plasma. The surface waves allow a surface wave plasma to be generated in a space inside the chamber 101.

Each of the slots 81a of the planar slot antenna 81 is formed in a proper shape and dimension such that the microwaves are uniformly radiated with high efficiency. For example, the shape of each of the slots 81a is a circular arc shape.

In this embodiment, the main amplifier 147, the tuner 170, and the planar slot antenna 81 are arranged adjacent to each other. A combination of the tuner 170 and the planar slot antenna 81 constitute a lumped constant circuit which exists in a ½ wavelength. In addition, a combined resistance of the planar slot antenna 81, the wave retardation member 82, and the dielectric member 92 is set to 50Ω. Thus, the tuner 170 can directly tune a plasma load, which makes it possible to transfer energy to the plasma with high efficiency.

<Operation of Plasma Processing Apparatus>

Next, an operation of the plasma processing apparatus 200 configured as above will be described.

First, the wafer W is loaded into the chamber 101 and is mounted on the susceptor 111. Thereafter, a plasma gas (e.g., an Ar gas) is introduced from the plasma gas supply source 127 into the chamber 101 through the pipe 128 and the plasma gas introduction member 126, and simultaneously, microwaves are transmitted from the microwave plasma source 102 into the chamber 101. Thus, a surface wave plasma is generated.

Subsequently, a process gas, for example, an etching gas such as a $Cl_2$ gas, is discharged from the process gas supply source 125 into the chamber 101 through the pipe 124 and the shower plate 120. This discharged process gas is excited by plasma which has passed through the space portions 123 of the shower plate 120 so that the process gas is plasmarized. In this way, the wafer W is subjected to a plasma process, for example, an etching process, by the plasma of the process gas.

When the surface wave plasma is generated, in the microwave plasma source 102, microwave power oscillated by the microwave oscillator 132 of the microwave output part 130 is amplified by the amplifier 133 and then distributed on a plurality of paths by the distributor 134. These distributed microwave powers are introduced to the respective microwave introduction mechanisms 190 of the microwave introduction part 140 via the microwave supply part 150.

At this time, microwave powers are supplied from a pair of the amplifying parts 142 of the microwave supply part 150 to the respective microwave introduction mechanism 190 through the coaxial lines 4. In the microwave introduction mechanism 190, the microwave powers supplied from the pair of amplifying parts 142 are combined by the power combiner 160. The combined microwaves reach the antenna part 180 via the transmission line 51 of the tuner 170. At this time, impedance is automatically matched by the first and second slugs 61a and 61b of the tuner 170. In the antenna part 180, the microwaves as surface waves pass through the wave retardation member 82 and subsequently, radiated through the slots 81a of the planar slot antenna 81. Subsequently, the microwaves pass through the dielectric member 92 of the top plate 90 and reach the surface of the dielectric member 92 that is in contact with plasma. The surface waves allow a surface wave plasma to be generated in a space inside the chamber 101.

As described above, the power combiner 160 is installed in each of the microwave introduction mechanisms 190 to combine the microwave powers supplied from the pair of amplifying parts 142 of the microwave supply part 150, and the microwaves are introduced into the chamber 101 through the antenna part 180. Such a configuration is adapted for the case where a large amount of power is required to generate plasma. Further, since a single of the microwave introduction mechanism 190 can supply a high microwave power, it is possible to reduce the number of the microwave introduction mechanisms 190, which is required for the plasma process.

Moreover, since the power combiner 160 has the same configuration as the power combiner 100, the power combiner 160 can be miniaturized compared to the power combiner which is available in the marketplace, which makes it possible to prevent the microwave introduction mechanism 190 from being bulky.

Furthermore, like the power combiner 100, the power combiner 160 can output a microwave mainly using a TEM mode by suppressing the occurrence of a higher order mode. Therefore, the microwave can be introduced into the chamber 101 with high efficiently, thus performing a highly efficient plasma process. In addition, microwave powers having the same phase and power are supplied through the microwave power introduction ports 2a and 2b of the power combiner 160. Therefore, the reflection of the microwaves is substantially unlikely to occur, which makes it possible to achieve a power combination with very high efficiency. The microwaves may have a frequency in a wide range of 500 to 3,000 MHz. In particular, the present disclosure is effective when power is insufficient at a low frequency of 500 to 1,000 MHz (for example, 860 MHz) at which high power is obtained.

<Other Applications>

The present disclosure is not limited to the above embodiments, and a variety of modifications can be made within the scope of the present disclosure.

As an example, although in the above embodiments, two power introduction ports has been described to be installed, the present disclosure is not limited thereto. Further, although in the above embodiments, the power combiner of the present disclosure has been described to be provided to the microwave introduction mechanism which is used in the microwave plasma source for forming a surface wave plasma inside the chamber, the present disclosure is not limited thereto. In some embodiments, the power combiner may be provided to all applications which require combining power supplied as electromagnetic waves. Furthermore, although in the above embodiments, the plurality of microwave introduction mechanisms has been described to be used, a single microwave introduction mechanism may be used.

According to the present disclosure in some embodiments, microwave powers fed through power introduction ports are combined using a power combining antenna in a state where poles of leading ends of antenna members are in contact with an inner member and a reflection part is configured to have a ring shape. This configuration has no joint, which prevents a strong electric field from being radiated at the joint. Therefore, it is possible to output microwave mainly using a TEM mode by suppressing the occurrence of a higher order mode, and combine electromagnetic waves with high efficiency even for a high power. Further, only by installing a power feeding antenna having a predetermined structure in the power introduction ports without an internal reflection absorption resistor, it is possible to miniaturize a power combiner.

While certain embodiments have been described, these embodiments have been presented by way of example only, and are not intended to limit the scope of the disclosure. Indeed, the embodiments described herein may be embodied in a variety of other forms. Furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A power combiner, comprising:
   a main body having a coaxial structure composed of an outer conductor and an inner conductor;
   a plurality of power introduction ports installed in a lateral side of the outer conductor and configured to introduce electromagnetic wave powers supplied through power supply lines into the main body;
   a power combining antenna configured to radiate electromagnetic waves which are supplied through the plurality of power introduction ports via the power supply lines, to a space between the outer conductor and the inner conductor of the main body such that the powers are combined; and
   an output port through which the combined electromagnetic wave is outputted from the main body,
   wherein the power combining antenna includes:
   a plurality of antenna members, each of which has a first pole to which the electromagnetic waves are supplied from the power supply line in each of the plurality of power introduction ports and a second pole that is in contact with the inner conductor; and
   a reflection part installed in a ring shape along an outer side of the inner conductor from both sides of each of the plurality of antenna members and configured to reflect the electromagnetic waves,
   wherein a standing wave is formed by the electromagnetic waves incident onto the plurality of antenna members and the electromagnetic waves reflected at the reflection part, and the electromagnetic wave powers are combined by a linked behavior between an induced magnetic field and an induced electric field, which are generated inside the main body by the standing wave so that the combined power propagates through the interior of the main body, followed by being outputted through the output port.

2. The power combiner of claim 1, wherein the number of the plurality of power introduction ports is two such that they are installed to face each other.

3. The power combiner of claim 2, wherein the number of the plurality of antenna members is two such that they are installed in a line to correspond to the two power introduction ports, respectively.

4. The power combiner of claim 1, wherein the electromagnetic wave powers having the same phase and power are supplied through the plurality of power introduction ports.

5. The power combiner of claim 1, further comprising: a reflection plate installed in an end portion of the main body to face the output port,
   wherein the electromagnetic wave powers supplied from the power combining antenna reflect at the reflection plate and subsequently propagate through the main body.

6. The power combiner of claim 5, further comprising: a wave retardation member installed between the reflection plate and the power combining antenna.

7. A microwave introduction mechanism for introducing microwaves into a chamber in a microwave plasma source which forms a surface wave plasma inside the chamber by the microwaves, comprising:
   a power combiner configured to combine microwave powers supplied from a plurality of power supply lines;
   an antenna part including a microwave radiating antenna configured to radiate the microwave power combined by the power combiner into the chamber; and
   a tuner configured to transmit the microwave power combined by the power combiner and configured to match an impedance of a load that includes plasma inside the chamber with a characteristic impedance of a microwave power supply,
   wherein the power combiner includes:
   a main body having a coaxial structure composed of an outer conductor and an inner conductor;
   a plurality of power introduction ports installed in a lateral side of the outer conductor and configured to introduce the microwave powers supplied through the plurality of power supply lines into the main body;
   a power combining antenna configured to radiate the microwave powers which are introduced through the plurality of power introduction ports via the plurality of power supply lines, to a space between the outer conductor and the inner conductor of the main body such that the microwave powers are combined; and
   an output port through which the combined microwave is outputted from the main body,
   wherein the power combining antenna includes:
   a plurality of antenna members, each of which has a first pole to which the microwaves are supplied from the power supply line in each of the plurality of power introduction ports and a second pole that is in contact with the inner conductor; and
   a reflection part installed in a ring shape along an outer side of the inner conductor from both sides of each of the plurality of antenna members and configured to reflect the microwaves,
   wherein a standing wave is formed by the microwaves incident onto the plurality of antenna members and the microwaves reflected at the reflection part, and the microwave powers are combined by a linked behavior between an induced magnetic field and an induced electric field, which are generated inside the main body by the standing wave so that the combined power propagates through the interior of the main body, followed by being outputted through the output port.

8. The microwave introduction mechanism of claim 7, wherein the number of the plurality of power introduction ports in the power combiner is two such that they are installed to face each other.

9. The microwave introduction mechanism of claim 8, wherein the number of the plurality of antenna members in the power combiner is two such that they are installed in a line to correspond to the two power introduction ports, respectively.

10. The microwave introduction mechanism of claim 7, wherein the electromagnetic wave powers having the same phase and power are supplied through the plurality of power introduction ports in the power combiner.

11. The microwave introduction mechanism of claim 7, wherein the power combiner further includes: a reflection plate installed in an end portion of the main body to face the output port,
  wherein the microwave powers supplied from the power combining antenna reflect at the reflection plate and subsequently propagate through the main body.

12. The microwave introduction mechanism of claim 11, further comprising: a wave retardation member installed between the reflection plate and the power combining antenna.

13. The microwave introduction mechanism of claim 7, wherein the tuner is a slug tuner including two slugs made of a dielectric material.

14. The microwave introduction mechanism of claim 7, wherein the antenna part includes a planar slot antenna having slots through which the microwaves are radiated.

15. The microwave introduction mechanism of claim 7, wherein the antenna part includes a wave retardation member made of a dielectric material and configured to shorten a wavelength of the microwave that reaches the microwave radiating antenna,
  wherein a phase of the microwave is adjusted by adjusting a thickness of the wave retardation member.

* * * * *